(12) United States Patent
Chen et al.

(10) Patent No.: US 11,195,743 B2
(45) Date of Patent: Dec. 7, 2021

(54) ADJUSTABLE SUBSTRATE SUPPORT AND ADJUSTMENT METHOD

(71) Applicant: TAIWAN SEMICONDUCTOR MANUFACTURING COMPANY LIMITED, Hsin-Chu (TW)

(72) Inventors: Ching-Hua Chen, Zhubei (TW); Kai-Fa Ho, New Taipei (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days.

(21) Appl. No.: 16/931,812

(22) Filed: Jul. 17, 2020

(65) Prior Publication Data

US 2021/0066114 A1 Mar. 4, 2021

Related U.S. Application Data

(60) Provisional application No. 62/894,665, filed on Aug. 30, 2019.

(51) Int. Cl.
*G03F 7/20* (2006.01)
*H01L 21/687* (2006.01)
*H01L 21/68* (2006.01)

(52) U.S. Cl.
CPC .... *H01L 21/68742* (2013.01); *G03F 7/70725* (2013.01); *G03F 7/70775* (2013.01); *H01L 21/681* (2013.01); *H01L 21/6875* (2013.01); *H01L 21/68757* (2013.01)

(58) Field of Classification Search
CPC .. G03F 7/70691; G03F 7/70716; G03F 7/707; G03F 7/70783; H01L 21/6875

USPC .................. 355/30, 53, 72, 75, 77
See application file for complete search history.

(56) References Cited

U.S. PATENT DOCUMENTS

| | | | | |
|---|---|---|---|---|
| 4,666,291 A | * | 5/1987 | Taniguchi | G03F 7/703 355/52 |
| 5,094,536 A | * | 3/1992 | MacDonald | B23Q 1/032 250/491.1 |
| 2004/0233404 A1 | * | 11/2004 | Hayashi | G03F 7/70783 355/53 |
| 2005/0061995 A1 | * | 3/2005 | Vink | G03F 7/707 250/492.1 |
| 2006/0098176 A1 | * | 5/2006 | Gui | G03F 7/70783 355/53 |
| 2011/0292369 A1 | * | 12/2011 | Lafarre | G03F 7/707 355/72 |
| 2012/0327386 A1 | * | 12/2012 | Huang | G03F 7/7085 355/72 |

(Continued)

*Primary Examiner* — Colin W Kreutzer
(74) *Attorney, Agent, or Firm* — Cooper Legal Group, LLC (57) ABSTRACT

A stage for supporting a semiconductor substrate is disclosed. The stage includes a platform that defines a plurality of apertures, and a plurality of burls that protrude from the apertures, where the plurality of burls have support surfaces for supporting a region of the semiconductor substrate. The stage includes an actuator coupled to at least a first burl included in the plurality of burls, wherein the actuator is operable to adjust an elevation of a first support surface of the first burl relative to the platform, and control circuitry that controls operation of the actuator to establish a substantially-planar alignment of the support surface of the first burl with a support surface of at least a second burl included in the plurality of burls.

20 Claims, 8 Drawing Sheets

(56) References Cited

U.S. PATENT DOCUMENTS

| | | | |
|---|---|---|---|
| 2013/0146785 A1* | 6/2013 | Gilissen | G03F 7/707 250/453.11 |
| 2013/0164688 A1* | 6/2013 | Cadee | G03F 7/2051 430/322 |
| 2018/0188660 A1* | 7/2018 | Poiesz | G03F 7/707 |
| 2019/0189593 A1* | 6/2019 | Kim | H01L 22/12 |
| 2020/0166855 A1* | 5/2020 | Judge | G03F 7/70708 |

* cited by examiner

ADJUSTABLE SUBSTRATE SUPPORT AND ADJUSTMENT METHOD

CROSS-REFERENCE TO RELATED APPLICATIONS

This application claims the benefit of U.S. Provisional Application No. 62/894,665, filed Aug. 30, 2019, which is incorporated in its entirety herein by reference.

BACKGROUND

Generally, during semiconductor fabrication various layers of material are formed on a substrate, such as a semiconductor wafer. The layers are often patterned to form semiconductor features, such as different elements of transistors. The substrate is generally supported on a stage during at least some of the fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the Figs. The spatially relative terms are intended to encompass different orientations of the device in use or operation in addition to the orientation depicted in the Figs. The apparatus may be otherwise oriented (rotated 90 degrees or at other orientations) and the spatially relative descriptors used herein may likewise be interpreted accordingly.

Some embodiments relate to a stage for supporting a substrate formed, at least in part, from a semiconductor material or a material on which a semiconductor circuit is to be formed. According to some embodiments, the stage includes a platform defining a plurality of apertures. Some embodiments of the platform are formed from silicon carbide for durability that resists wear from repeated substrate loading and unloading operations. The apertures can be distributed in a regular pattern, formed in a major surface of the platform that supports the substrate, extending through a depth dimension of the platform. For example, the apertures can be spaced equal distances from each other to form a pitch that is five (5 mm) millimeters or less. Some embodiments of the pitch can be three (3 mm) millimeters or less. Some embodiments of the pitch can be two (2 mm) millimeters or less. The pitch defines the distance that a first aperture is separated from a nearest neighboring apertures.

Some embodiments of the platform can have a circular footprint, or comprise a circular region that defines the apertures. For example, the platform can be a rigid structure, having a diameter of at least two hundred (200 mm) millimeters. Other embodiments of the platform can have a diameter of at least three hundred (300 mm) millimeters. The diameter of the platform, or the diameter of the region of the platform defining apertures can also have an upper size limit according to any of the embodiments. For example, the diameter can be limited to no more than six hundred (600 mm) millimeters, or no more than four hundred (400 mm) millimeters.

According to some embodiments, the diameter of the platform can be approximately the same as the diameter of the substrate to be supported. For example, to be "approximately" the same, the diameter of the circular platform or region of the platform defining the apertures can be chosen to be within twice the pitch of the apertures. For example, for a platform defining apertures with a three millimeter (3 mm) pitch, the diameter of the platform or aperture-defining region can be no more than six millimeters (6 mm) smaller than the diameter of the substrate to be supported. In a platform with such a diameter, the external perimeter of a properly-positioned substrate does not form or is much less likely to form a cantilever extending beyond the diameter of the platform or region defining the apertures by a value greater than the pitch.

Some embodiments of the stage include a plurality of burls. The burls protrude upward from the apertures. The burls include a support surface at a top, or uppermost region of the burls extending upward from the platform. A height above the platform that the substrate is to be supported atop the support surfaces is established by the extent to which the burls protrude upwardly from the apertures. Some embodiments of the burls are cylindrical in shape. The cross-section of such burls can have a diameter that is less than or equal to five (5 mm) millimeters. According to other embodiments of the cylindrical burls, the outside diameter is less than or equal to two (2 mm) millimeters.

Some embodiments of the burls are formed from silicon carbide. Silicon carbide can undergo a physical change in response to repeated exposure to semiconductor substrates. For example, a first burl arranged closer to a perimeter of the platform than a second burl may be subject to greater wear than the second burl, which is located relatively closer to a central region of the platform than the first burl. Thus, the support surface of a first burl and the support surface of a second burl can be in non-planar alignment over time. Accordingly, the height of a support surface of the first burl is to be adjusted to compensate for wear, and establish substantially-planar alignment of the support surface of the first burl with a support surface of a second burl. The second burl can be stationary, having a support surface with a non-adjustable height relative to the platform. For some embodiments, however, the second burl can also include a support surface with an adjustable height relative to the platform and the first burl.

An actuator is provided to the stage in some embodiments, and coupled to at least a first burl included in the plurality of burls. The actuator is operable to adjust an elevation of a support surface of the first burl relative to the platform. An illustrative embodiment of the actuator includes a micro-electric drive motor. For example, the drive motor can be a piezoelectric device that deflects in response to being supplied with an electric current. According to some embodiments, a stepper motor can be utilized to cause adjustment of the height of the support surface provided to one or more of the burls.

For some embodiments, the actuator can be coupled to a drive shaft to translate a force generated by the actuator to the burl with the support surface having an adjustable height. For example, the drive shaft can be linearly aligned with the burl having the support surface with the adjustable height. A linear force imparted by the actuator onto the drive shaft is conveyed to the burl with the support surface having the adjustable height. Movement of the drive shaft adjusts the extent to which the burl protrudes from the aperture of the platform, and accordingly, the height of the support surface above the platform is adjusted.

According to some embodiments, the actuator can generate a rotational force. The rotational force can cause a cam coupled to a shaft driven by the actuator to pivot about a rotational axis. The rotational axis of the cam can be offset from a central point of the cam, resulting in a lobe of the cam being pivoted about the rotational axis. The lobe extends further from a periphery of the cam than at least another portion of the periphery of the cam. As the cam pivots about the rotational axis, the distance separating the cam's periphery from an underside of the platform changes, resulting in the burl with the support surface having the adjustable height being pushed upward, to further protrude from the aperture in the platform. Accordingly, the height of the support surface of that burl is adjusted upward. The cam can continue to be pivoted to lower the burl.

According to some embodiments, the actuator can include an inflatable bladder can be disposed vertically beneath the platform. An air compressor, reservoir storing a compressed gas, or other source of a gas to inflate the bladder can be in fluid communication with the bladder. A valve or other flow controller can regulate the flow of gas from the source into the bladder. When inflated, the bladder expands to urge a surface of the bladder towards an underside of the platform. An external surface of the bladder contacts a drive shaft coupled to the burl, or a bottom portion of the burl with the support surface having an adjustable height, thereby adjusting the extent to which the burl protrudes from the aperture in the platform and the height of the support surface.

The examples of the actuator described herein are not exhaustive, and other actuators that are operable to adjust the height of the support surface are also within the scope of the present disclosure.

Control circuitry is operatively connected to communicate with the actuator. The control circuitry responds to an input signal by emitting an output signal that controls operation of the actuator. Operation of the actuator under the control of the control circuitry establishes a substantially-planar alignment of the support surface of the first burl with a support surface of at least a second burl included in the plurality of burls. As a result, planarity or uniformity of a semiconductor substrate supported atop the support surfaces is promoted.

According to some embodiments, a level sensor senses a condition where the support surface of the first burl is not in substantially-planar alignment with the support surface of the second burl. For example, an optical image capture device such as a CMOS or CCD camera, for example, optically detects an unevenly supported region of the semiconductor substrate supported by the burls. Some embodiments of the level sensor include a light source that illuminates a surface of the semiconductor substrate when the semiconductor substrate is supported by the platform. The level sensor senses light reflected by the exposed surface of the semiconductor substrate to sense that the support surface of the first burl is not in substantially-planar alignment with the support surface of the second burl.

The optical image capture device can have a sensitivity that detects deflections of a first region of the semiconductor substrate relative to a second region of the semiconductor substrate. In response to detecting such a deflection, the optical image capture device transmits a deflection signal to the control circuitry. The control circuitry interprets the deflection signal to identify the one or more burls with a support surface requiring a height adjustment to establish substantially-planar alignment of the support surfaces. The control circuitry, in turn, controls operation of the actuator to adjust an extent to which one or more burls protrude from respective apertures defined by the platform, thereby establishing substantially-planar alignment of the support surfaces.

Establishing substantially-planar alignment of the support surfaces provides uniform support to each of a plurality of regions of the substrate to inhibit deflection of the regions of the substrate that might otherwise result if those regions were unsupported. The regions of the substrate supported by the support surfaces that are in substantially-planar alignment are available to be processed to form operable semiconductor devices on those regions.

Figure 1:
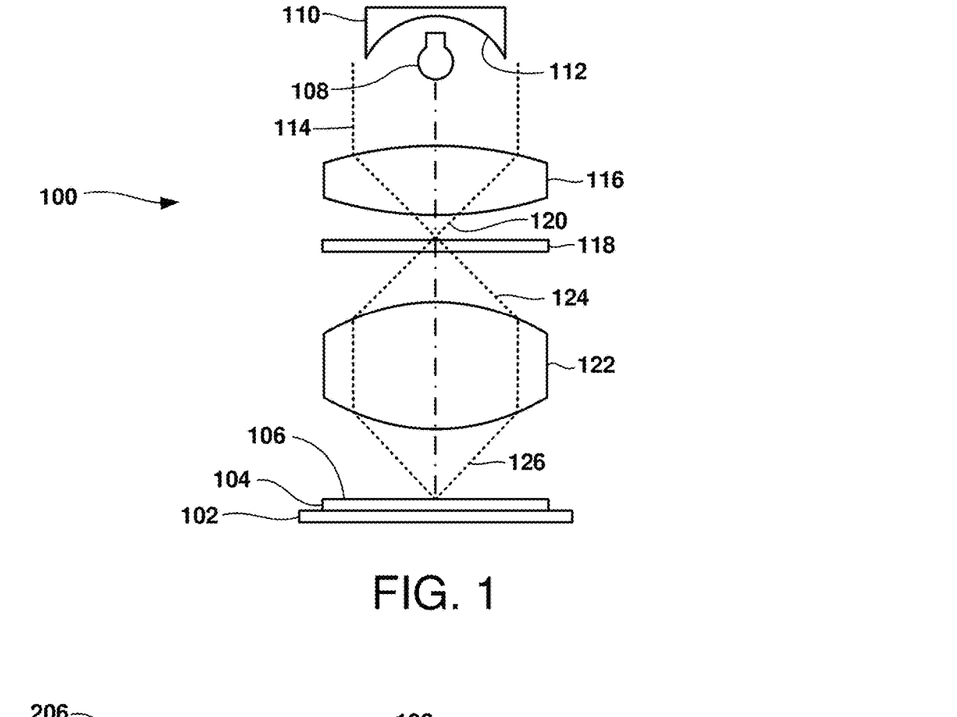
FIG. 1 illustrates a lithography apparatus comprising a stage, according to some embodiments.

Referring now to the drawings, FIG. 1 shows a schematic view of a lithography apparatus 100 according to some embodiments. A stage 102 supports a semiconductor substrate 104 on which a plurality of layers are to be formed by a series of fabrication operations. According to some embodiments, the semiconductor substrate 104 can be formed from a semiconducting material such as crystalline silicon, for example, and the fabrication operations can include at least one of doping, etching, deposition, patterning, or any other operation.

According to some embodiments, the lithography apparatus 100 comprises a patterning system that transfers a pattern to a surface 106 of the semiconductor substrate 104. In some embodiments, a photoresist material is formed on the surface 106 of the semiconductor substrate 104 such that the pattern is transferred to the photoresist material. The patterning system comprises a light source 108, such as an ultraviolet bulb arranged adjacent to a reflector 110. Some embodiments of the reflector 110 comprise a concave, reflective surface 112 that directs light 114 emitted by the light source 108 toward an optical lens 116.

According to some embodiments, the optical lens 116 focuses the light 114 to illuminate a mask 118 comprising the pattern to be transferred to the surface 106. For example, the optical lens 116 can be a condenser lens, which renders divergent light 114 from the light source 108, as reflected by the reflective surface 112, into parallel or converging beams 120. The parallel or converging beams 120 are focused by the optical lens 116 to fully illuminate the pattern defined by the mask 118.

According to some embodiments, a projection lens 122 is arranged between the mask 118 and the surface 106. For example, the projection lens 122 comprises one or a plurality of lens elements that magnify light 124 passing through the mask 118, and focuses the magnified light 126 to be cast onto the surface 106. The magnified light 126 reacts with the photoresist material, thereby developing a positive or a negative pattern on the surface 106. The pattern can then be transferred to one or more layers on the semiconductor substrate 104.

The pattern being cast by the magnified light 126 is in focus at a defined distance from the projection lens 122, in a direction toward the semiconductor substrate 104. Portions of the pattern conveyed by magnified light 126 cast onto portions of the surface 106 of the semiconductor substrate 104 that are further than the defined distance from the projection lens 122 are out of focus, or "defocused." As a result, edges of the defocused pattern are not well defined, and do not appear crisp on the surface 106 of the semiconductor substrate 104. Instead, gradual transitions may exist between the pattern and neighboring regions, which can result in short circuits or other stray signals between circuit components formed in different layers.

Figure 2A:
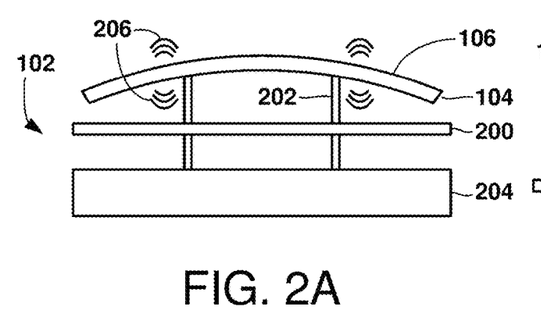
FIG. 2A illustrates a side view of a portion of a stage comprising an electrostatic clamping system configured to utilize an electrostatic force to clamp a substrate to a platform of a stage, according to some embodiments.

According to some embodiments, such as that shown in FIG. 2A, the stage 102 includes a platform 200 on which the semiconductor substrate 104 is supported. Because the semiconductor substrate 104 may not be perfectly planar, a plurality of electrically-conductive pins 202 conduct electric current supplied by a base 204. The pins 202 conducting the electric current charge the semiconductor substrate 104 to a polarity that is the opposite of the polarity of the platform 200, generating a field 206 that causes the platform 200 to attract, or "clamp" the semiconductor substrate 104 to the platform 200, thereby urging the semiconductor substrate 104 into a planar shape.

Figure 2B:
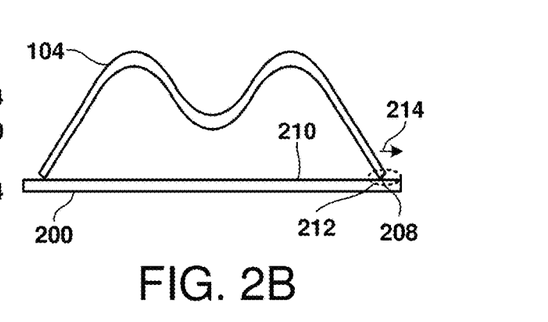
FIG. 2B illustrates a side view of the substrate in FIG. 2A interacting with portions of the platform, wherein the interactions cause a physical change to support surfaces as a result of repeated clamping of the substrate to the platform, according to some embodiments.

Clamping the semiconductor substrate 104 to the platform 200 causes portions of the semiconductor substrate 104 to make contact with regions of the platform 200, as shown in FIG. 2B. For example, an edge region 208 of a concave downward semiconductor substrate 104 can make contact with a top 210 of the platform 200. As the semiconductor substrate 104 is urged toward a planar shape while being clamped to the platform 200, the edge region 208 can slide over the top 210 of the platform 200 in an outward direction, as indicated generally by the arrow 214. The edge region 208 traveling over the what is a peripheral region 212 of the top 210 of the platform 200 in FIG. 2B, scrapes or otherwise removes material from the top 210 of the platform 200, damaging the peripheral region 212 of the platform 200.

Figure 3A:
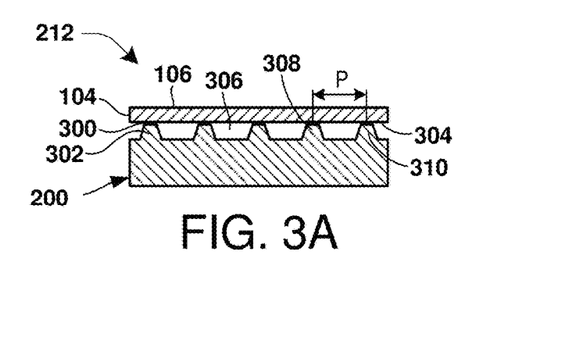
FIG. 3A illustrates a cutaway view showing a substrate supported by support surfaces of a plurality of burls protruding from a platform of a stage, the support surfaces being in substantially-planar alignment, according to some embodiments.
Figure 3B:
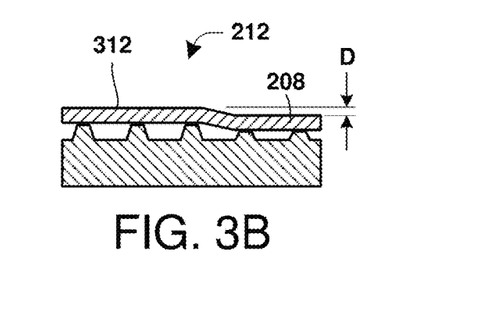
FIG. 3B illustrates a cutaway view showing a substrate supported by support surfaces of a plurality of burls protruding from a platform of a stage, at least some of the support surfaces not being in substantially-planar alignment, according to some embodiments.

According to some embodiments, described with reference to FIGS. 3A and 3B, such abrasive damage to the peripheral region 212 of the top 210 of the platform 200 can result in non-planar alignment of support surfaces 300 that support the semiconductor substrate 104 on the platform 200. An enlarged view of the peripheral region 212 with support surfaces 300 in substantially-planar alignment is shown in FIG. 3A. According to some embodiments, the support surfaces form a top of burls that protrude upward from the platform 200. The support surfaces 300 of some embodiments, support the underside 304 of the semiconductor substrate 104 at discrete locations, separated by gaps 306.

The distance between the center of the support surface 300 of a first burl 308 and the center of the support surface 300 of a second burl 310 is referred to herein as pitch P. The pitch P can be substantially the same over the platform 200; substantially the same over a portion, but less than the entire platform 200; or variable. For example, the pitch can be five millimeters (5 mm) or less. Some embodiments of the pitch can be three millimeters (3 mm) or less. Some embodiments of the pitch can be two millimeters (2 mm) or less. The illustrated values of pitch P offer different degrees of support to the underside 304 of the semiconductor substrate 104. A semiconductor substrate 104 on which 400 nm semiconductor devices are to be formed may require less support, meaning a greater pitch P, than a semiconductor substrate 104 on which 300 nm semiconductor devices are to be formed, for example. The relatively-small semiconductor scale leaves less room for stray currents, for example, than the relatively-large semiconductor scale. Accordingly, the semiconductor substrate 104 for the relatively-small semiconductor scale devices may be required to be closer to a true planer shape than the semiconductor substrate 104 for the relatively-large semiconductor scale.

The support surfaces 300 in FIG. 3A are in substantially-planar alignment. As used herein, "substantially-planar alignment" includes planar alignment of the support surfaces 300 of the burls within a region of the platform 200. However, according to some embodiments, substantially-planar alignment is not necessarily absolutely planar, but includes differences in the height of the support surfaces 300 that are within ±10%, ±5%, ±2%, or ±1%. The substantially-planar alignment of the support surfaces atop the burls provides sufficient support of the semiconductor substrate 104 across the diameter of the semiconductor substrate 104 to control deflection of the edge region 208 of the semiconductor substrate 104. As a result, the yield of operational semiconductor devices that can be formed adjacent to the edge region 208 of the semiconductor substrate 104 is improved relative to the yield that can be realized without substantially-planar alignment of the support surfaces 300.

As mentioned above, the top 210 of the platform 200 can experience wear in response to repeated clamping of semiconductor substrates 104 to the platform 200, for example. According to some embodiments, the support surfaces 300 that support the edge region 208 of the semiconductor substrate 104 can be worn down, as shown in FIG. 3B. As a result of such wear, the edge region 208 deflects downward a distance D relative to a central region 312 of the semiconductor substrate 104 when the semiconductor substrate 104 is clamped to the platform 200. The distance D of the deflection spaces the edge region 208 of the semiconductor substrate 104 further from the projection lens 122 than the central region 312. For embodiments of the projection lens 122 in focus at the central region 312, the pattern cast onto the edge region 208 by the projection lens 122 will be less focused or defocused.

Figure 4A:
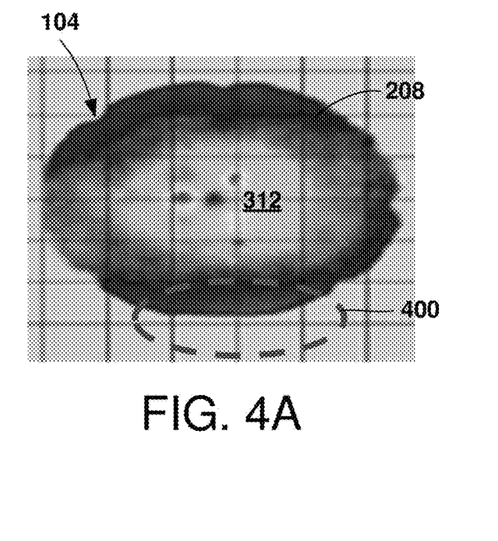
FIG. 4A illustrates a map of a substrate exhibiting edge defocus as a result of support surfaces not being in substantially-planar alignment, according to some embodiments.

FIG. 4A illustrates a heat map of a semiconductor substrate 104, representing deviations from a planar shape of the semiconductor substrate 104 clamped to a platform 200 comprising support surfaces 300 that are not in substantially-planar alignment. As shown in FIG. 4A, the central region 312 of the semiconductor substrate 104 is supported by support surfaces 300 in substantially-planar alignment, maintaining the central region at the focal distance of the projection lens 122. In contrast, the edge region 208 is supported by support surfaces 300 that are not in substantially planar alignment, such as support surfaces 300 that have worn down. As a result, the edge region 208 exhibits edge deflection, causing the pattern cast onto the edge region 208 to be defocused. A portion 400 of the edge region, circled in broken lines, exhibits severe edge deflection, being separated a greater distance from the projection lens 122 than other portions of the edge region 208.

Figure 4B:
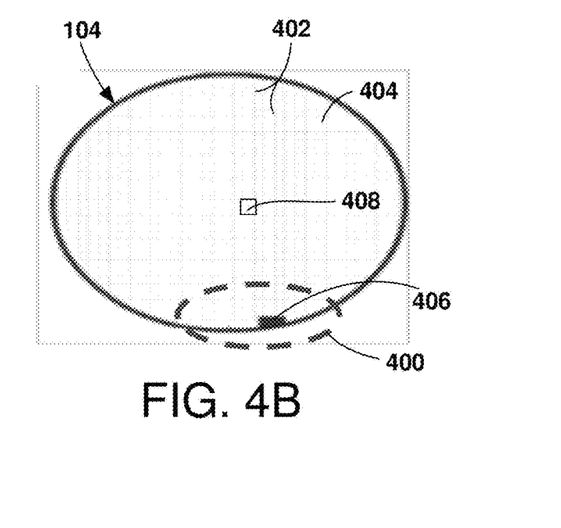
FIG. 4B illustrates a map of a substrate highlighting a location where one or a plurality of dies are formed in a region of the substrate that exhibits edge defocus as a result of support surfaces not being in substantially-planar alignment according to some embodiments.

FIG. 4B illustrates some embodiments of a semiconductor substrate 104 with cut lines 402 dividing the semiconductor substrate 104 into dies 404. A first die 406 formed in the portion 400 of the edge region 208 of the semiconductor substrate 104 exhibiting severe edge defocus has features that are out of focus relative to the pattern defined by the mask 118. A second die 408 formed in the central region 312 of the semiconductor substrate 104 exhibits little to no defocus, as the second die 408 was supported at the focal distance of the projection lens 122. Accordingly, the features of the second die 408 are in focus, and accurately reflect the pattern defined by the mask 118.

Figure 5A:
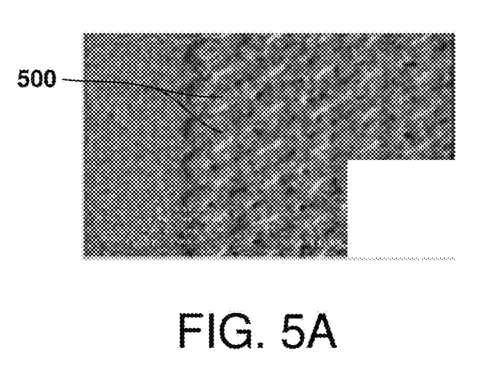
FIG. 5A is a Critical Dimension Scanning Electron Microscope ("CD SEM") image of the region of the substrate highlighted in FIG. 4B, illustrating a defocused view of a pattern formed on the substrate resulting from insufficient support of the region of the substrate according to some embodiments.
Figure 5B:
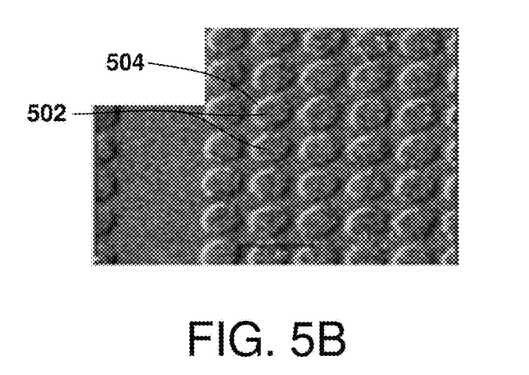
FIG. 5B is a CD SEM image of a region of a substrate supported by support surfaces that are in substantially-planar alignment, illustrating a defocused view of a pattern formed on the substrate according to some embodiments.

For example, FIG. 5A shows a Critical Dimension Scanning Electron Microscope ("CD SEM") image of features formed as part of the first die 406, and FIG. 5B shows a CD SEM image of features formed as part of the second die 408. As shown in the example of FIG. 5A, semiconducting features 500 forming a portion of the first die 406 are not well defined. The boundaries are not readily apparent, causing the features to blur together in the CD SEM image. As a result, the first die 406 may be prone to short circuits between the features 500 that render the first die 406 inoperable and, if so, will constitute waste. In comparison, the features 502 of the second die 408 have well-defined borders 504, maintaining electrical isolation between the features 502 as required to render the second die 408 operable.

In addition to parasitic signals between features 500 in the first die 406, undesired short circuits between features formed in different layers of the first die 406 may result from edge deflection of the semiconductor substrate 104 on the platform 200. For example, a conductive feature formed in a first layer on the semiconductor substrate 104 may be laterally offset relative to a second conductive feature formed in a contiguous layer of the semiconductor substrate 104. Due to the defocus of the pattern caused by the edge deflection, the conductive features of the first layer and the contiguous layer may partially or fully overlap, causing an undesired short circuit between the conductive features.

Figure 6A:
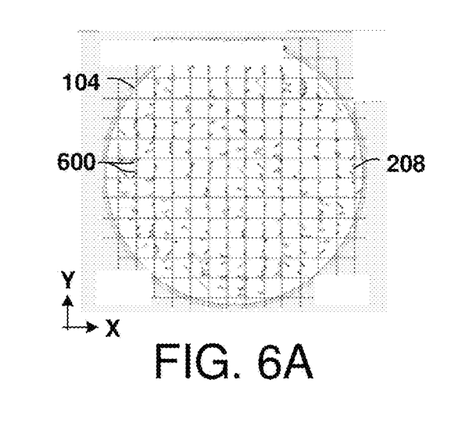
FIG. 6A is an overlay map illustrating alignment between layers formed on a substrate supported by support surfaces in substantially-planar alignment, according to some embodiments.

To illustrate the effect of limited edge deflection toward overlapping features of contiguous layers, FIG. 6A is an example of an overlay map illustrating relatively-uniform alignment between features in contiguous layers of the semiconductor substrate 104 as defined by the mask 118 for each layer. The edge region 208 of the semiconductor substrate 104 represented in FIG. 6A is supported by support surfaces 300 that are in substantially-planar alignment. The arrows 600 in FIG. 6A indicate relatively-minor overlap, with a maximum overlap along the X axis of 9.2 nm and a maximum overlap along the Y axis of 8.2 nm.

Figure 6B:
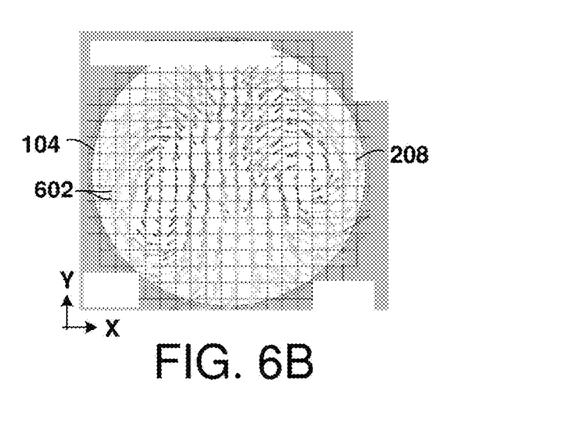
FIG. 6B is an overlay map illustrating alignment between layers formed on a substrate supported by support surfaces that are not in substantially-planar alignment, according to some embodiments.

To illustrate the effect that substantial edge deflection has on overlapping features of contiguous layers, FIG. 6B is an example of an overlay map illustrating substantial misalignment of features in contiguous layers of the semiconductor substrate 104, relative to the designed alignment defined by the mask 118 for each layer. The edge region 208 of the semiconductor substrate 104 represented in FIG. 6B is supported by support surfaces 300 that are not in substantially-planar alignment. The arrows 602 in FIG. 6B indicate substantial overlap, with a maximum overlap along the X axis of 36.4 nm and a maximum overlap along the Y axis of 34.1 nm.

Figure 7:
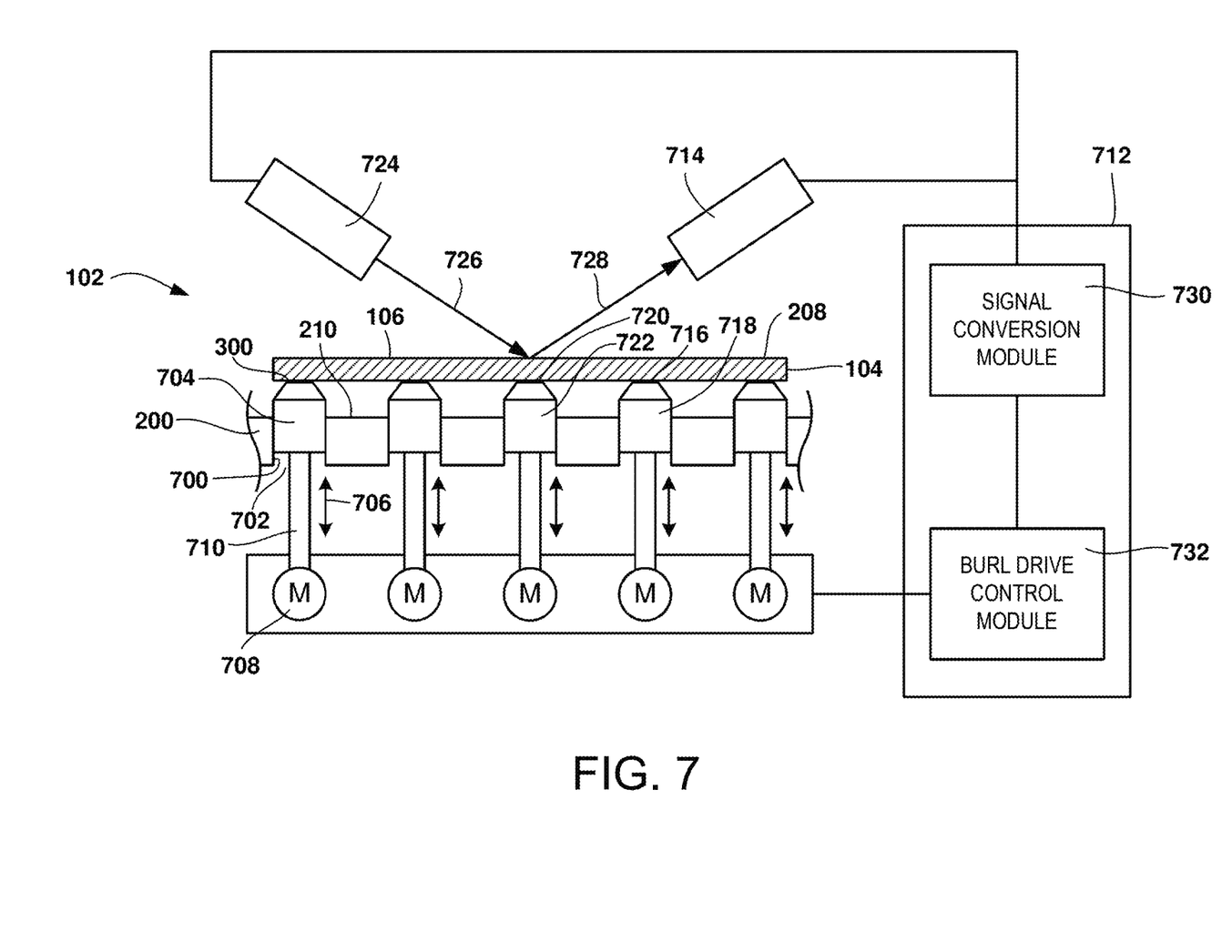
FIG. 7 is a side view of a lithography apparatus comprising adjustable support surfaces in accordance with some embodiments.

A stage 102 comprising adjustable support surfaces 300 is shown in FIG. 7. An elevation of at least one, a plurality, or all of the support surfaces 300 is adjustable relative to the platform 200 to mitigate deflection of a region of a semiconductor substrate 104 in real time, without requiring the platform 200 to be replaced or taken out of service to be repaired. According to some embodiments, the stage 102 comprises a platform 200 comprising walls 700 defining a plurality of apertures 702.

Some embodiments of the stage 102 comprise a plurality of adjustable burls 704 that are vertically adjustable in directions indicated by arrows 706 to protrude from the apertures 702. Adjustment of the adjustable burls 704 changes an elevation of the support surfaces 300 above the top 210 of the platform 200 for supporting the regions of the semiconductor substrate 104. According to some embodiments, the apertures 702 can be spaced equal distances from each other to form a pitch P between the adjustable burls 704 that is five (5 mm) millimeters or less. Some embodiments of the pitch P can be three (3 mm) millimeters or less. Some embodiments of the pitch P can be two (2 mm) millimeters or less.

According to some embodiments, the platform 200 or the adjustable burls 704, including the support surfaces 300, can be formed from silicon carbide, or any other material that is suitably durable to resist wear from repeated clamping of the semiconductor substrate 104 to the platform 200, and is not reactive with the materials to which the platform 200 or burls 704 are exposed during the fabrication process. Some embodiments of the adjustable burls 704 are generally cylindrical in shape, comprising a cross section with an outside diameter that is less than or equal to two millimeters (2 mm).

Some embodiments of the stage 102 shown in FIG. 7 comprise at least one, or a plurality of actuators 708 that are controllable to adjust at least one, or a plurality of the adjustable burls 704 in the directions of arrow 706 to place the support surfaces 300 in substantially-planar alignment. For example, the actuators 708 can comprise a microelectric drive unit such as a piezoelectric actuator; a stepper motor coupled to an off-center cam that pivots to cause adjustment of the adjustable burls 704; an inflatable bladder that, when inflated, causes adjustment of one or more of the adjustable burls 704 relative to the platform 200; or any other actuator that is controllable to adjust the position of one or more adjustable burls 704 relative to the platform 200. Some embodiments of the stage 102 comprise a connecting rod 710 that extends between the adjustable burls 704 and their respective actuator 708, transmitting the force generated by the one or more actuators 708 to adjust the position of the adjustable burls 704.

According to some embodiments, a first actuator 708 is operable to adjust the extent to which a plurality of the adjustable burls 704 protrude above the top 210 of the platform 200. For such embodiments, a plurality of the adjustable burls 704 are controlled as a group. According to some embodiments a plurality of actuators 708 are separately coupled to different adjustable burls 704, for independently adjusting an elevation of the support surfaces 300 of the different adjustable burls 704 relative to the platform 200 to establish substantially-planar alignment of the support surfaces 300 of the different adjustable burls 704 at an elevation vertically above the platform 200.

Control circuitry 712 is operatively connected to the one or more actuators 708, to control operation of the one or more actuators 708 and establish substantially-planar alignment of the support surfaces 300 of the adjustable burls 704. According to some embodiments, the control circuitry 712 is responsive to output from a level sensor 714 that senses a condition indicating that a first support surface 716 of a first adjustable burl 718, included among the plurality of adjustable burls 704, is not in substantially-planar alignment with at least a second support surface 720 of a second adjustable burl 722 included in the plurality of adjustable burls 704.

According to some embodiments, the level sensor 714 comprises an optical image capture device that optically detects an unevenly-supported region of the semiconductor substrate 104, such as an edge region 208 exhibiting edge deflection. Examples of the optical image capture device include, but are not limited to a CMOS or CCD camera, for example, that optically detects changes in elevation of the surface 106 of the semiconductor substrate 104 to detect an unevenly supported region of the semiconductor substrate 104.

To improve the ability of the level sensor 714 to detect an unevenly-supported region of the semiconductor substrate 104, some embodiments of the stage 102 comprise a light source 724 that illuminates the surface 106 of the semiconductor substrate 104 supported by the platform 200. For example, the light source 724 can include a LED bulb or an array of LED bulbs. The light source emits light 726 at a defined angle relative to the surface 106 of the semiconductor substrate 104. The level sensor 714 is positioned to detect a reflected portion 728 of the light 726, and convert the reflected portion 728 of the light 726 at different regions of the surface 106 into a signal that is output to the control circuitry 712. According to some embodiments, the control circuitry 712 comprises a signal conversion module 730 that converts the signal output by the level sensor 714 into a region of the semiconductor substrate 104 that is not adequately supported by one or more support surfaces 300 in substantially-linear alignment with an adjacent support surface 300.

Figure 8A:
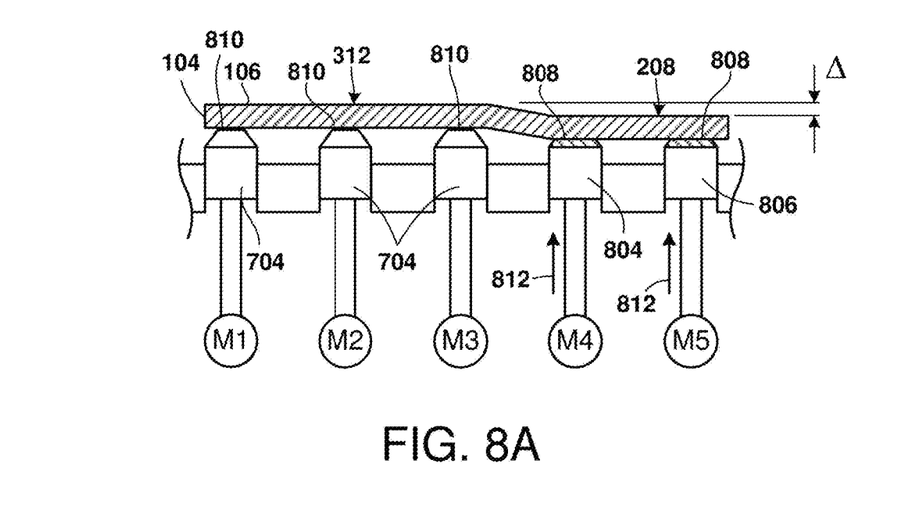
FIG. 8A is side view of a substrate supported by a plurality of burls with support surfaces that are not in substantially-planar alignment, in accordance with some embodiments.
Figure 8B:
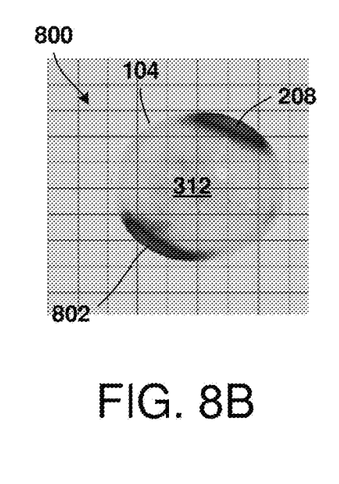
FIG. 8B is topography map of a surface of a substrate supported by a plurality of burls with support surfaces that are not in substantially-planar alignment, illustrating edge deformation exhibited by the substrate, in accordance with some embodiments.

For example, as shown in FIG. 8A, the level sensor 714 detects that the edge region 208 of the semiconductor substrate 104 illuminated by the light source 724 is exhibiting edge deflection. The level sensor 714 also senses a quantity, such as a percentage or amount of the light 726 that is included in the reflected portion 728 for example, that is indicative of a distance $\Delta$ that the edge region 208 is deflected from a surface 106 at a central region 312 of the semiconductor substrate 104. FIG. 8B shows an illustrative example of a topography map 800 of the surface 106 of the semiconductor substrate 104 in FIG. 8A. The edge region 208 is one region of the semiconductor substrate 104 exhibiting edge deflection, along with a second edge region 802 on an opposite side of the semiconductor substrate 104 from the edge region 208.

According to some embodiments, the signal conversion module 730 converts the signal output by the level sensor 714 to determine: (i) which of the plurality of adjustable burls 704 requires adjustment to eliminate or lessen the edge deflection (i.e., adjust the deflection distance $\Delta$ to zero), and (ii) the extent to which the actuators 708 that adjust the identified adjustable burls 704 are to be operated to eliminate or lessen the deflection distance Δ. For the example in FIG. 8A, the signal conversion module 730 identifies adjustable burls 804 and 806 as comprising support surfaces 808 that are not in substantially-planar alignment with support surfaces 810.

According to some embodiments, the signal conversion module 730 converts the output from the level sensor 714 into a drive signal that is transmitted to a burl drive control module 732 (FIG. 7). The burl drive control module 732 controls operation of one or more of the actuators 708 based on the output of the signal conversion module 730 to bring the support surfaces into substantially-planar alignment. For the example in FIG. 8A, the burl drive control module 732 energizes actuators M4 and M5 to adjust the position of adjustable burls 804 and 806 a distance in the direction of arrows 812 equal to the deflection distance Δ, bringing the support surfaces 808 into substantially-planar alignment with the support surfaces 810.

Figure 9A:
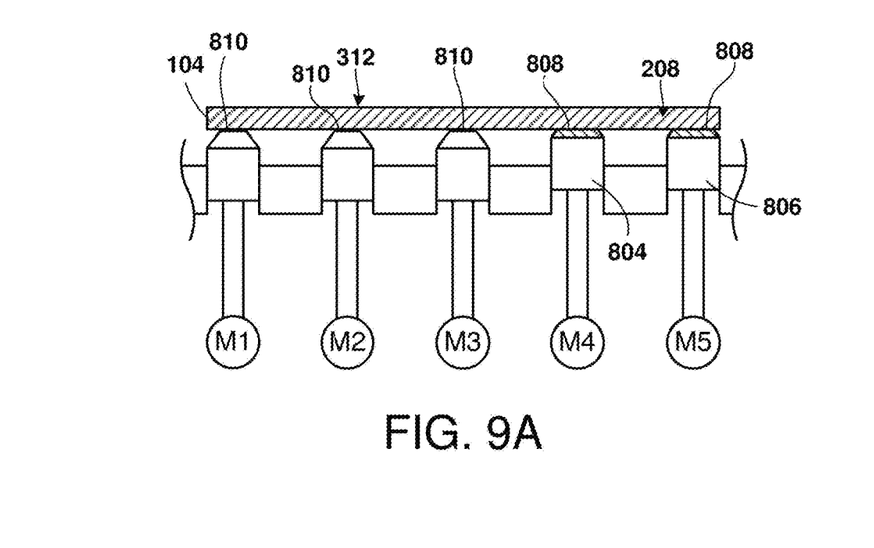
FIG. 9A is side view of a substrate supported by a plurality of burls that have been adjusted relative to a platform to position support surfaces in substantially-planar alignment, in accordance with some embodiments.
Figure 9B:
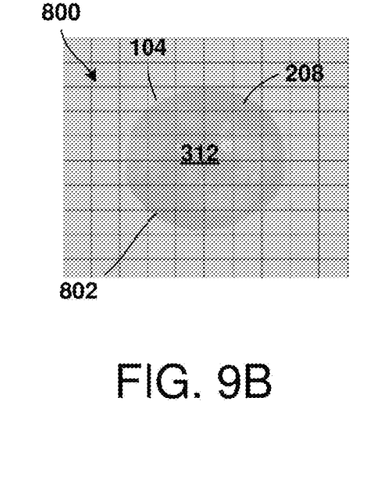
FIG. 9B is topography map of a surface of a substrate supported by a plurality of burls with support surfaces that are in substantially-planar alignment, illustrating a substantially-planar surface of the substrate, in accordance with some embodiments.

According to some embodiments, FIGS. 9A and 9B show the result of the adjustment of the adjustable burls 804 and 806. The support surfaces 808 supporting the edge region 208 are in substantially-planar alignment with support surfaces 810. Further, the topography map 800 shown in FIG. 9B indicates that the edge regions 280 and 802 that previously exhibited edge deflection, are supported at approximately the same elevation as the central region 312. As a result, the edge regions 208 and 802 where the pattern would have been defocused, are now exposed to a focused pattern defined by the mask 118. According to some embodiments, the support surface 808 of the adjustable burls 804, 806 are formed from a material that undergoes a change in response to repeated exposure to semiconductor substrates 104, exhibiting wear over time for example. The control circuitry 712 controls adjustment of an elevation of the support surface 808 of the adjustable burls 804 and 806 to compensate for the change and establish the substantially-planar alignment of the support surface 808 of the adjustable burls 804 and 806 with the support surfaces 810 of the other adjustable burls 704.

Figure 10:
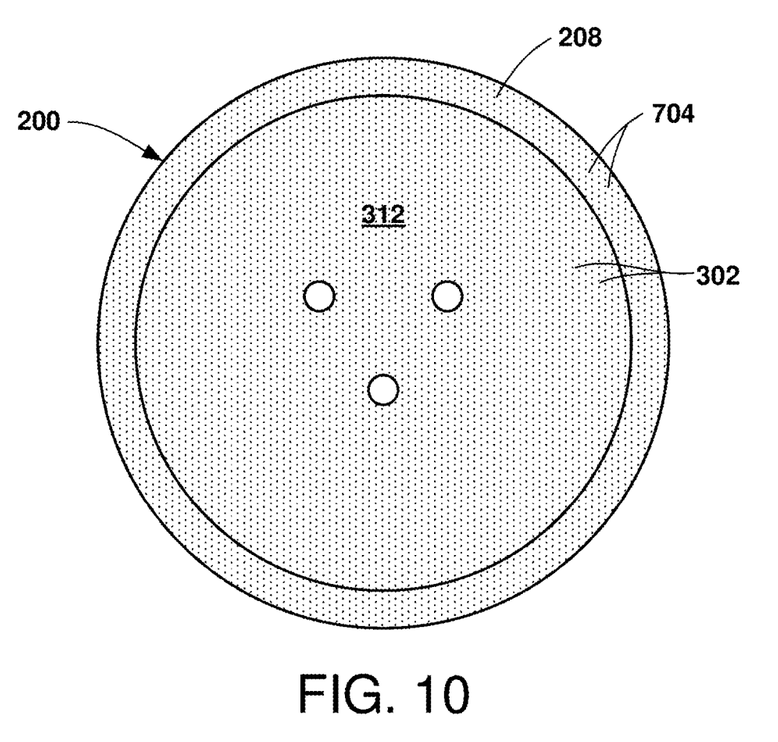
FIG. 10 illustrates a circular platform comprising adjustable burls arranged about an edge region of the platform and stationary burls arranged within a central region of the platform.

The foregoing examples described a circular platform 200 or the arrangement of the adjustable burls 704 in a circular arrangement, however, the present disclosure is not so limited. According to some examples, the platform 200 can have a footprint of any shape. Further, the embodiments described above comprise adjustable burls 704 over the entire platform, but again, the present disclosure is not so limited. According to some embodiments such as that shown in FIG. 10, for example, the adjustable burls 704 can be arranged within an edge region 208 extending about at least a portion, and optionally an entire circumference about a circular platform 200. According to some embodiments, the central region 312 of the platform 200 can comprise a plurality of stationary burls 302 comprising support surfaces 300 that are supported at a fixed elevation. For such embodiments, the adjustable burls 704 are adjustable as described herein to position the support surfaces 300 of the adjustable burls 704 in substantially-planar alignment with the support surfaces 300 of the stationary burls 302.

According to some embodiments comprising a circular platform 200 or circular region comprising the adjustable burls 704, the platform 200 or region of the platform 200 can comprise a diameter of at least two hundred (200 mm) millimeters. Other embodiments of the platform 200 or region can have a diameter of at least three hundred (300 mm) millimeters. The diameter of the platform 200, or the diameter of the region of the platform 200 defining apertures 702 can also have an upper size limit according to any of the embodiments. For example, the diameter can be limited to no more than six hundred (600 mm) millimeters, or no more than four hundred (400 mm) millimeters.

Figure 11:
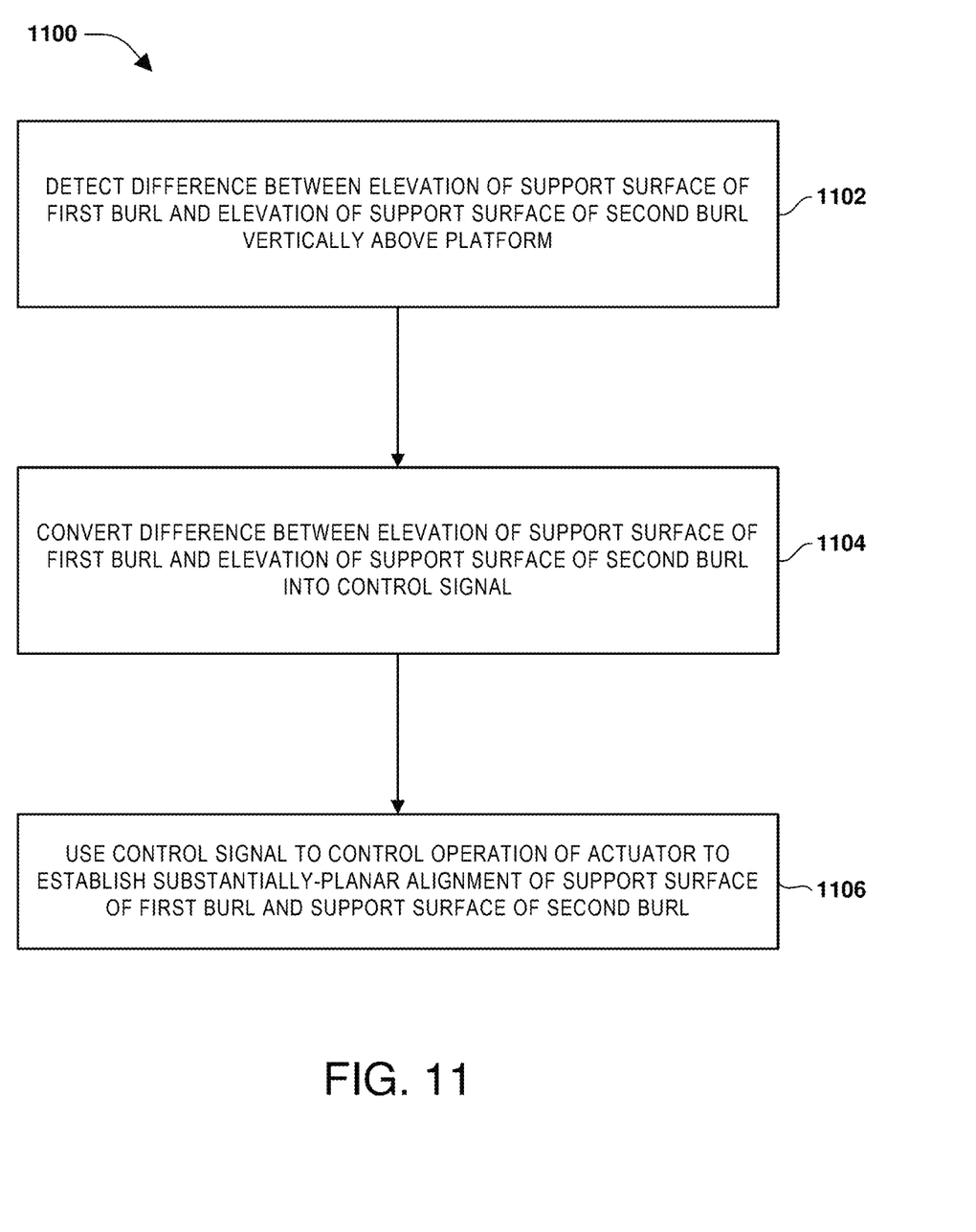
FIG. 11 is a flow diagram illustrating a method of supporting a semiconductor substrate, in accordance with some embodiments.

A method 1100 of supporting a semiconductor substrate during a fabrication operation is shown in the flow diagram of FIG. 11, according to some embodiments. In some embodiments, the actions illustrated in FIG. 11 are performed under the control of a computer-implemented control system, such as computing device 1312 in FIG. 13 for example, executing computer-executable instructions stored by a non-transitory, computer-readable medium 1208, shown in FIG. 12. The level sensor 714, at 1102, detects a quantity indicative of a difference between: (i) an elevation of a support surface 300 of a first burl protruding from an aperture 702 formed in a platform 200 of a stage 102, and (ii) an elevation of a support surface 810 of a second burl vertically above the platform 200 of the stage 102.

At 1104, the detected difference between the elevation of the support surface 300 of the first burl and the elevation of the support surface 300 of the second burl is converted into a control signal. According to some embodiments, the difference between the elevations of the support surface 300 of the first burl and the support surface 300 of the second burl 704 comprises optically sensing a reflected portion 728 of light 726 reflected from the surface 106 of the semiconductor substrate 104 supported by the stage 102. According to some embodiments, the control signal identifies the first burl as requiring adjustment, and the extent of adjustment required to correct the deflection distance Δ exhibited by a region, such as the edge region 208.

The operation of the actuator M4 (FIG. 8) coupled to the first adjustable burl 804 is controlled, at 1106, to adjust the elevation of the support surface 300 of the first adjustable burl 804 relative to the platform 200 to establish a substantially-planar alignment of the support surface 300 of the first adjustable burl 804 with the support surface 300 of the second burl 704. Operation of the actuator M4 is controlled, according to some embodiments, based on the converted signal output by the signal conversion module 730.

Figure 12:
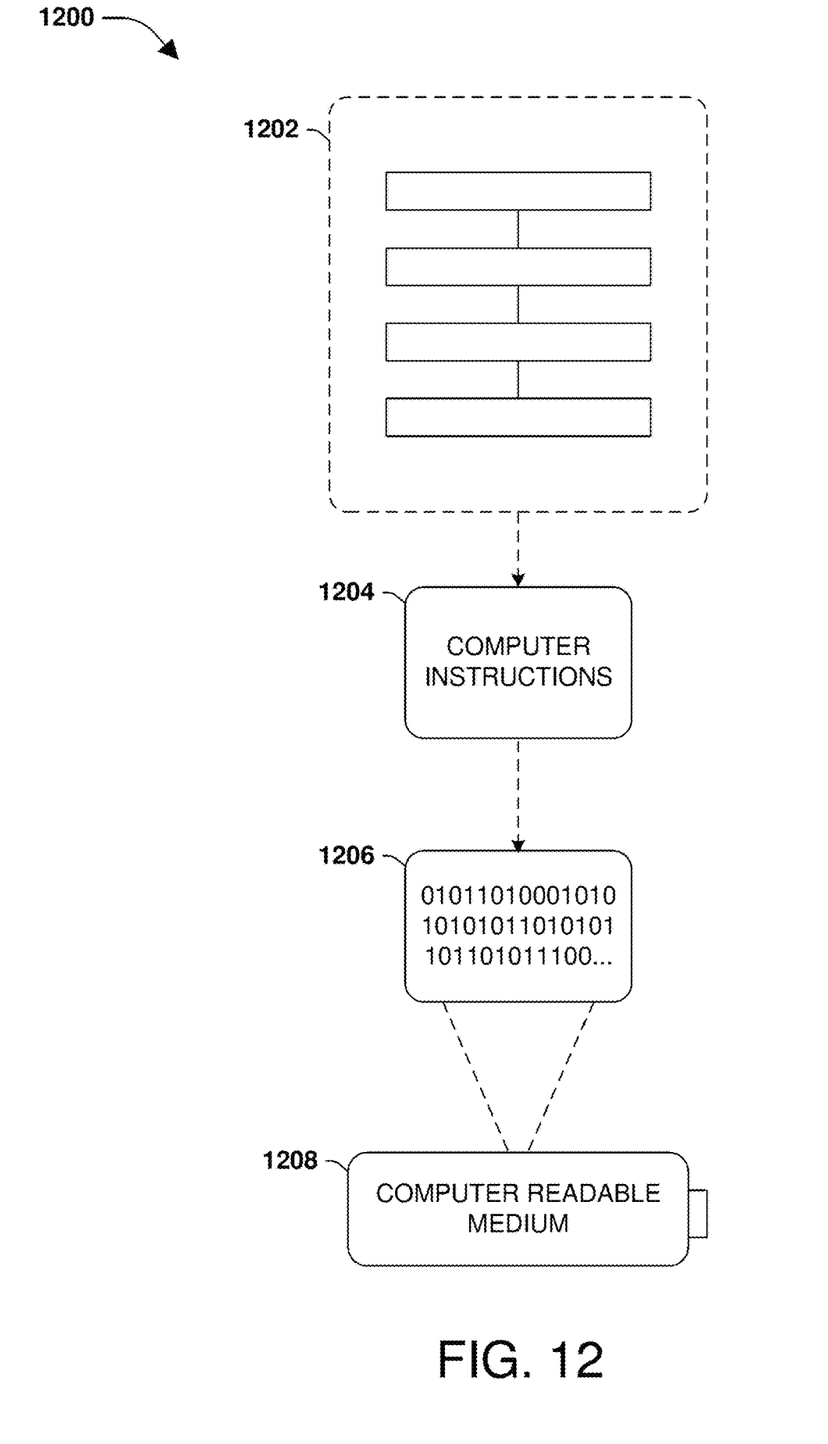
FIG. 12 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium 1208 is illustrated in FIG. 12, and is embodied as a CD-R, DVD-R, flash drive, a platter of a hard disk drive, etc., on which is encoded computer-readable data 1206. This computer-readable data 1206 in turn comprises a set of processor-executable computer instructions 1204 that when executed implement one or more of the provisions set forth herein. In some embodiments, the processor-executable computer instructions 1204 are configured to perform a method 1202, such as at least some of the aforementioned described methods. In some embodiments, the processor-executable computer instructions 1204 are configured to implement a system, such as at least some of the aforementioned systems. Many such computer-readable media may be devised by those of ordinary skill in the art that are configured to operate in accordance with the techniques presented herein.

Figure 13:
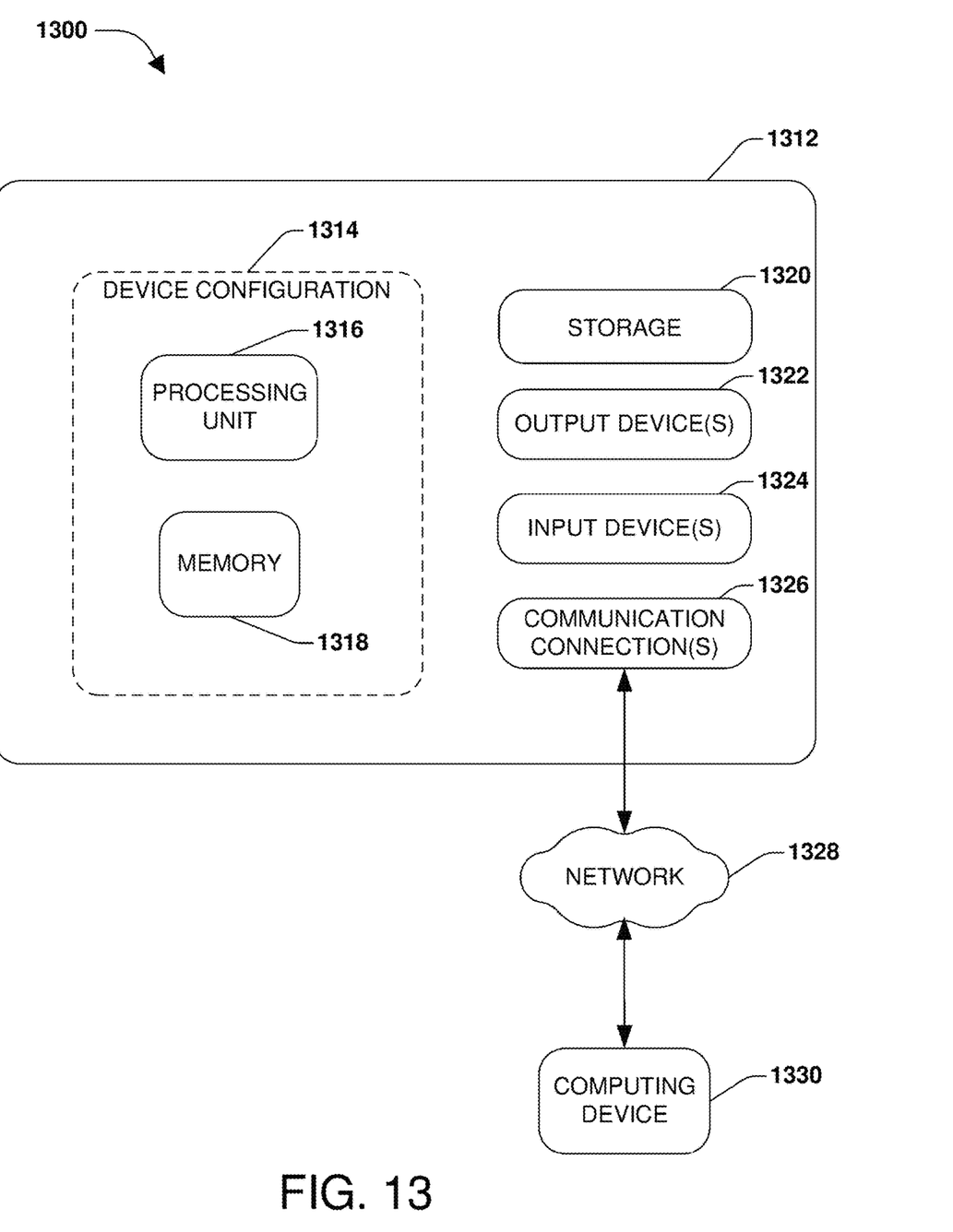
FIG. 13 illustrates an example computing environment wherein one or more of the provisions set forth herein may be implemented, in accordance with some embodiments.

FIG. 13 and the following discussion provide a brief, general description of a suitable computing environment to implement embodiments of one or more of the provisions set forth herein. The operating environment of FIG. 13 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 13 depicts an example of a system 1300 comprising a computing device 1312 configured as the controller system to implement some embodiments provided herein. In some configurations, computing device 1312 includes at least one processing unit 1316 and memory 1318. Depending on the exact configuration and type of computing device, memory 1318 may be volatile (such as RAM, for example), non-volatile (such as ROM, flash memory, etc., for example) or some combination of the two. This configuration is illustrated in FIG. 13 by dashed line 1314.

In some embodiments, computing device 1312 may include additional features and/or functionality. For example, computing device 1312 may also include additional storage (e.g., removable and/or non-removable) including, but not limited to, magnetic storage, optical storage, and the like. Such additional storage is illustrated in FIG. 13 by storage 1320. In some embodiments, computer readable instructions to implement one or more embodiments provided herein may be in storage 1320. Storage 1320 may also store other computer readable instructions to implement an operating system, an application program, and the like. Computer readable instructions may be loaded in memory 1318 for execution by processing unit 1316, for example.

The term "computer readable media" as used herein includes computer storage media. Computer storage media includes volatile and nonvolatile, removable and non-removable media implemented in any method or technology for storage of information such as computer readable instructions or other data. Memory 1318 and storage 1320 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1312. Any such computer storage media may be part of computing device 1312.

Computing device 1312 may also include communication connection(s) 1326 that allows computing device 1312 to communicate with other devices. Communication connection(s) 1326 may include, but is not limited to, a modem, a Network Interface Card (NIC), an integrated network interface, a radio frequency transmitter/receiver, an infrared port, a USB connection, or other interfaces for connecting computing device 1312 to other computing devices. Communication connection(s) 1326 may include a wired connection or a wireless connection. Communication connection(s) 1326 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1312 may include input device(s) 1324 such as keyboard, mouse, pen, voice input device, touch input device, infrared cameras, video input devices, and/or any other input device. Output device(s) 1322 such as one or more displays, speakers, printers, and/or any other output device may also be included in computing device 1312. Input device(s) 1324 and output device(s) 1322 may be connected to computing device 1312 via a wired connection, wireless connection, or any combination thereof. In some embodiments, an input device or an output device from another computing device may be used as input device(s) 1324 or output device(s) 1322 for computing device 1312.

Components of computing device 1312 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1312 may be interconnected by a network. For example, memory 1318 may be comprised of multiple physical memory units located in different physical locations interconnected by a network.

Those skilled in the art will realize that storage devices utilized to store computer readable instructions may be distributed across a network. For example, a computing device 1330 accessible via a network 1328 may store computer readable instructions to implement one or more embodiments provided herein. Computing device 1312 may access computing device 1330 and download a part or all of the computer readable instructions for execution. Alternatively, computing device 1312 may download pieces of the computer readable instructions, as needed, or some instructions may be executed at computing device 1312 and some at computing device 1330.

In some embodiments, adjusting one or a plurality of adjustable burls to establish substantially-planar alignment of support surfaces improves surface uniformity in at least an edge region of a semiconductor substrate. Improved surface uniformity controls defocusing of a pattern defined by a mask that would otherwise occur if deflection occurred as a result of support surfaces not being in substantially-planar alignment.

The embodiments described herein include an actuator coupled to at least a first burl, to adjust a height of a support surface of the first burl relative to a height of a support surface of a second burl above a platform. However, some embodiments include a plurality of burls having a support surface with a height that is adjustable relative to the platform. Some embodiments of the actuator are coupled to the first and second burls, to adjust the height of the support surfaces of the first and second burls. Such adjustment can be independent, meaning that the actuator can adjust the height of the support surface of the first burl independently of the height of the support surface of the second burl. However, some embodiments include an actuator coupled to the first and second burls to adjust the heights of the support surface of the first and second burls collectively. For some embodiments, a plurality of actuators are separately coupled to different burls, for independently adjusting an elevation of support surfaces of different burls relative to the platform to establish substantially-planar alignment of support surfaces.

According to some embodiments, a stage for supporting a semiconductor substrate is disclosed. The stage includes a platform that defines a plurality of apertures, and a plurality of burls that protrude from the apertures, where the plurality of burls have support surfaces for supporting a region of the semiconductor substrate. The stage includes an actuator coupled to at least a first burl included in the plurality of burls, wherein the actuator is operable to adjust an elevation of a first support surface of the first burl relative to the platform, and control circuitry that controls operation of the actuator to establish a substantially-planar alignment of the first support surface of the first burl with a second support surface of a second burl included in the plurality of burls.

According to some embodiments, a lithography apparatus is disclosed. The lithography apparatus includes a light source that emits light and a stage that supports a semiconductor substrate at a location where a mask shields portions of the semiconductor substrate from the light emitted by the light source to transfer a pattern of electronic circuitry defined by the mask onto the semiconductor substrate. The stage includes a plurality of stationary burls that protrude upward from an inner portion of a platform, wherein the stationary burls are fixed relative to the platform and have a stationary support surface for supporting a central region of the semiconductor substrate, walls that define a plurality of apertures within an outer portion of the platform closer to a perimeter of the platform than the stationary burls, a plurality of adjustable burls that protrude from the apertures, the adjustable burls having an adjustable support surface for supporting a peripheral region of the semiconductor substrate, and an actuator coupled to the adjustable burls to adjust an elevation of a first support surface of the adjustable burls relative to the platform. The lithography apparatus also has control circuitry that controls operation of the actuator to establish a substantially-planar alignment of the adjustable support surface of the adjustable burls with the stationary support surface of the stationary burls.

According to some embodiments, a method of supporting a semiconductor substrate during a fabrication operation is provided. The method includes detecting a difference between: (i) an elevation of a first support surface of a first burl protruding from an aperture formed in a platform of a stage, and (ii) an elevation of a second support surface of a second burl vertically above the platform of the stage, converting the difference between the elevation of the first support surface of the first burl and the elevation of the second support surface of the second burl into a control signal, and based on the control signal, controlling operation of an actuator coupled to the first burl to adjust the elevation of the first support surface of the first burl relative to the platform of the stage to establish a substantially-planar alignment of the first support surface of the first burl with the second support surface of the second burl.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that components, sensors, actuators, substrates, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components the terms used to describe such components are intended to correspond, unless otherwise indicated, to any component which performs the specified function of the described component (for example, a term that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A stage for supporting a semiconductor substrate, the stage comprising:
    a platform that defines a plurality of apertures;
    a plurality of burls that protrude from the plurality of apertures, wherein:
        the plurality of burls comprise support surfaces for supporting a region of the semiconductor substrate, and
        at least one of the plurality of burls is a stationary burl that comprises a stationary support surface that is at a fixed elevation relative to the platform;
    an actuator coupled to at least a first burl included in the plurality of burls, wherein:
        the actuator is operable to adjust an elevation of a first support surface of the first burl relative to the platform, and
        the first burl is arranged closer to a perimeter of the platform than the stationary burl; and
    control circuitry that controls operation of the actuator to establish a substantially-planar alignment of the first support surface of the first burl with a second support surface of a second burl included in the plurality of burls.

2. The stage of claim 1 comprising a level sensor that senses the first support surface of the first burl is not in substantially-planar alignment with the second support surface of the second burl, and transmits a signal that causes the control circuitry to control operation of the actuator to adjust an extent to which the first burl protrudes from a respective aperture defined by the platform.

3. The stage of claim 2, wherein the level sensor comprises an optical image capture device that optically detects an unevenly-supported region of the semiconductor substrate supported by the plurality of burls to sense that the first support surface of the first burl is not in substantially-planar alignment with the second support surface of the second burl.

4. The stage of claim 2 comprising a light source that illuminates a surface of the semiconductor substrate when the semiconductor substrate is supported by the platform, and the level sensor senses light reflected by the surface of the semiconductor substrate to sense that the first support surface of the first burl is not in substantially-planar alignment with the second support surface of the second burl.

5. The stage of claim 1 comprising a plurality of actuators that are separately coupled to different burls, for independently adjusting an elevation of support surfaces of the different burls relative to the platform to establish substantially-planar alignment of the support surfaces of the different burls at an elevation vertically above the platform.

6. The stage of claim 1, wherein the first support surface of the first burl is formed from a material that undergoes a change in response to repeated exposure to semiconductor substrates, and the control circuitry controls adjustment of an elevation of the first support surface of the first burl to compensate for the change and establish the substantially-planar alignment of the first support surface of the first burl with the second support surface of the second burl.

7. The stage of claim 1, wherein the plurality of burls have a pitch over a surface of the platform that is less than or equal to five (5 mm) millimeters.

8. The stage of claim 1, wherein the plurality of burls are generally cylindrical in shape, and a cross section of the plurality of burls have an outside diameter that is less than or equal to two (2 mm) millimeters.

9. The stage of claim 1, wherein the platform or the plurality of burls are formed from silicon carbide.

10. The stage of claim 1, wherein a region of the platform provided with the plurality of apertures has a circular footprint, and a diameter that is less than or equal to four hundred (400 mm) millimeters.

11. A lithography apparatus comprising:
    a light source that emits light;
    a stage that supports a semiconductor substrate at a location where a mask shields portions of the semiconductor substrate from the light emitted by the light source to transfer a pattern of electronic circuitry defined by the mask onto the semiconductor substrate, wherein the stage comprises:
        a plurality of stationary burls that protrude upward from an inner portion of a platform, wherein the plurality of stationary burls are fixed relative to the platform and comprise a stationary support surface for supporting a central region of the semiconductor substrate,
        walls that define a plurality of apertures within an outer portion of the platform closer to a perimeter of the platform than the plurality of stationary burls,
        a plurality of adjustable burls that protrude from the plurality of apertures, the plurality of adjustable burls comprising an adjustable support surface for supporting a peripheral region of the semiconductor substrate, and
        an actuator coupled to the plurality of adjustable burls to adjust an elevation of a first support surface of the plurality of adjustable burls relative to the platform; and
    control circuitry that controls operation of the actuator to establish a substantially-planar alignment of the adjustable support surface of the plurality of adjustable burls with the stationary support surface of the plurality of stationary burls.

12. The lithography apparatus of claim 11 comprising an optical lens that illuminates the pattern defined by the mask with the light emitted by the light source.

13. The lithography apparatus of claim 11 comprising a level sensor that senses the adjustable support surface is not in substantially-planar alignment with the stationary support surface, and transmits a signal that causes the control circuitry to operate the actuator to adjust an extent to which at least one of the plurality of adjustable burls protrudes from the plurality of apertures defined by the walls of the stage.

14. The lithography apparatus of claim 13 comprising a second light source that illuminates a surface of the semiconductor substrate when the semiconductor substrate is supported by the stage, and the level sensor senses light reflected by the surface of the semiconductor substrate to sense that the adjustable support surface is not in substantially-planar alignment with the stationary support surface.

15. The lithography apparatus of claim 13, wherein the plurality of adjustable burls are arranged in a circular pattern.

16. The lithography apparatus of claim 11, wherein the stage comprises a plurality of actuators that are separately coupled to different adjustable burls, for independently adjusting the different adjustable burls.

17. A method of supporting a semiconductor substrate during a fabrication operation, the method comprising:
    detecting a difference between: (i) an elevation of a first support surface of an adjustable burl protruding from an aperture formed in a platform of a stage and adjustable in elevation relative to the platform, and (ii) an elevation of a second support surface of a stationary burl vertically above the platform of the stage and fixed relative to the platform;

converting the difference between the elevation of the first support surface of the adjustable burl and the elevation of the second support surface of the stationary burl into a control signal; and based on the control signal, controlling operation of an actuator coupled to the adjustable burl to adjust the elevation of the first support surface of the adjustable burl relative to the platform of the stage to establish a substantially-planar alignment of the first support surface of the adjustable burl with the second support surface of the stationary burl.

18. The method of claim 17, wherein the first support surface of the adjustable burl and the second support surface of the stationary burl, when in the substantially-planar alignment, are in contact with a common portion of the semiconductor substrate.

19. The method of claim 17, wherein detecting the difference between the elevation of the first support surface of the adjustable burl and the elevation of the second support surface of the stationary burl comprises optically sensing light reflected from a surface of the semiconductor substrate supported by the stage.

20. The method of claim 17, wherein the adjustable burl is arranged closer to a perimeter of the platform than the stationary burl.

\* \* \* \* \*